US012761511B2

(12) United States Patent
Li et al.

(10) Patent No.: US 12,761,511 B2
(45) Date of Patent: Oct. 13, 2026

(54) SPLICING DISPLAY PANEL

(71) Applicant: TCL China Star Optoelectronics Technology Co., Ltd., Shenzhen (CN)

(72) Inventors: Lin Li, Shenzhen (CN); Bo Sun, Shenzhen (CN); Feng Zheng, Shenzhen (CN); Yichen Bai, Shenzhen (CN); Meng Chen, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 88 days.

(21) Appl. No.: 18/808,177

(22) Filed: Aug. 19, 2024

(65) Prior Publication Data

US 2024/0411170 A1 Dec. 12, 2024

Related U.S. Application Data

(63) Continuation of application No. 17/779,607, filed as application No. PCT/CN2022/093498 on May 18, 2022, now Pat. No. 12,111,529.

(30) Foreign Application Priority Data

Apr. 21, 2022 (CN) ......................... 202210423401.2

(51) Int. Cl.
*G02F 1/1333* (2006.01)
*G02F 1/13357* (2006.01)
(Continued)

(52) U.S. Cl.
CPC ........ *G02F 1/13336* (2013.01); *G02F 1/1336* (2013.01); *G09G 3/3208* (2013.01);
(Continued)

(58) Field of Classification Search
CPC . G02F 1/13336; G02F 1/1336; G09G 3/3208; G09G 3/3406; H10K 59/95; H10W 90/00
See application file for complete search history.

(56) References Cited

U.S. PATENT DOCUMENTS

| | | | | |
|---|---|---|---|---|
| 10,684,499 | B2 | 6/2020 | Wang et al. | |
| 2015/0346571 | A1* | 12/2015 | Sun ...................... | G02B 6/0083 362/633 |

(Continued)

FOREIGN PATENT DOCUMENTS

| | | |
|---|---|---|
| CN | 102708761 | 10/2012 |
| CN | 105044964 | 11/2015 |

(Continued)

OTHER PUBLICATIONS

CN-114373396-A, machine translation, Apr. 19, 2022 (Year: 2022).*

(Continued)

*Primary Examiner* — Tracie Y Green

(57) ABSTRACT

A splicing display panel is provided. The splicing display panel includes at least two spliced first display modules and at least one second display module. There is a seam between two adjacent first display modules. A portion of the first display module corresponding to a bezel area is provided with an accommodating slot. The accommodating slot of one of the first display modules is spliced with the accommodating slot of another one of the first display modules to form an accommodating cavity.

20 Claims, 2 Drawing Sheets

(51) Int. Cl.

| | |
|---|---|
| ***G09G 3/3208*** | (2016.01) |
| ***G09G 3/34*** | (2006.01) |
| ***H10K 59/95*** | (2026.01) |
| ***H10W 90/00*** | (2026.01) |

(52) U.S. Cl.
CPC .......... *G09G 3/3406* (2013.01); *H10K 59/95* (2023.02); *H10W 90/00* (2026.01)

(56) References Cited

U.S. PATENT DOCUMENTS

| | | | |
|---|---|---|---|
| 2016/0266437 | A1 | 9/2016 | Liu et al. |
| 2017/0025593 | A1 | 1/2017 | Bower et al. |
| 2022/0036776 | A1 | 2/2022 | Chao et al. |

FOREIGN PATENT DOCUMENTS

| | | | | |
|---|---|---|---|---|
| CN | 111653207 | | 9/2020 | |
| CN | 211826840 | | 10/2020 | |
| CN | 113376883 | | 9/2021 | |
| CN | 214669956 | | 11/2021 | |
| CN | 114038340 | | 2/2022 | |
| CN | 114141154 | | 3/2022 | |
| CN | 114283698 | | 4/2022 | |
| CN | 114355658 | | 4/2022 | |
| CN | 114373396 | A * | 4/2022 | ............... G09F 9/35 |
| JP | 2004-191487 | | 7/2004 | |
| JP | 2005-031247 | | 2/2005 | |
| JP | 2007-192977 | | 8/2007 | |
| JP | 2021-076752 | | 5/2021 | |

OTHER PUBLICATIONS

Examination Report Under Sections 12 & 13 of the Patents Act, 1970 and the Patents Rules, 2003 Dated Oct. 29, 2025 From the Government of India, Intellectual Property India, Patents, Designs, Trade Marks, Geographical Indications Re. Application No. 202227035555. (6 Pages).

Supplementary European Search Report and the European Search Opinion Dated Jan. 26, 2026 From the European Patent Office Re. Application No. 22730044.9. (10 Pages).

International Search Report and the Written Opinion Dated Dec. 26, 2022 From the International Searching Authority Re. Application No. PCT/CN2022/093498 and Its Translation Into English. (18 Pages).

Notice of Reasons for Refusal Dated May 28, 2024 From the Japan Patent Office Re. Application No. 2022-542063 and Its Translation Into English. (10 Pages).

Notice of Submission of Opinion Dated Jul. 17, 2023 From the Korean Intellectual Property Office Re. Application No. 10-2022-7022330 and Its Translation Into English. (6 Pages).

Notice of Submission of Opinion Dated Jan. 29, 2024 From the Korean Intellectual Property Office Re. Application No. 10-2022-7022330 and Its Translation Into English. (10 Pages).

Notification of Office Action and Search Report Dated Dec. 5, 2022 From the State Intellectual Property Office of the People's Republic of China Re. Application No. 202210423401.2 and Its Translation Into English. (23 Pages).

Notification of Office Action and Search Report Dated Jun. 5, 2023 From the State Intellectual Property Office of the People's Republic of China Re. Application No. 202210423401.2 and Its Translation Into English. (19 Pages).

Notice of Rejection Dated Jun. 10, 2025 From the Japan Patent Office Re. Application No. 2024-168075 and Its Translation Into English. (20 Pages).

* cited by examiner

SPLICING DISPLAY PANEL

RELATED APPLICATIONS

This application is a continuation application of U.S. patent application Ser. No. 17/779,607 filed on May 25, 2022, which is a National Phase of PCT Patent Application No. PCT/CN2022/093498 having International Filing Date of May 18, 2022, which claims the benefit of priority of Chinese Patent Application No. 202210423401.2 filed on Apr. 21, 2022. The contents of the above applications are all incorporated by reference as if fully set forth herein in their entirety.

TECHNICAL FIELD

The present disclosure relates to the field of display technologies, in particular to a splicing display panel.

BACKGROUND

Traditional display panels need to arrange a large number of metal traces in a bezel area, or liquid crystal displays usually use a sealant to encapsulate a liquid crystal structure. Black matrix and sealing regions disposed at an edge of the display panel lead to obvious black edges.

With a rapid development of an outdoor display market, large size and high resolution have become a development direction of outdoor displays. A traditional splicing display panel is usually formed by splicing multiple display panels. However, the traditional splicing display panel cannot eliminate seams, which affects the visual experience.

SUMMARY

Embodiments of the present disclosure provide a splicing display panel for eliminating seams of the splicing display panel.

The embodiments of the present disclosure provide a splicing display panel including:

- at least two spliced first display modules, where there is a seam between two of the first display modules which are adjacent and spliced, each of the first display modules includes a display area and a bezel area arranged outside the display area, a portion of the first display module corresponding to the bezel area is provided with an accommodating slot, an opening of the accommodating slot is arranged on a side of the bezel area close to the seam, and the opening of the accommodating slot is communicated with the seam; and in two adjacent first display modules, the accommodating slot of one of the first display modules is spliced with the accommodating slot of another one of the first display modules to form an accommodating cavity;
- at least one second display module arranged in the accommodating cavity, where the second display module covers the seam;
- an optically clear adhesive filled in the seam.

Alternatively, in some embodiments of the present disclosure, a material of the optically clear adhesive is selected from an organic silicone, an acrylic glue, an epoxy sealant, and a polyurethane glue, or a combination thereof.

Alternatively, in some embodiments of the present disclosure, each of the first display modules includes a first substrate and a second substrate opposite to the first substrate, the first substrate includes a first recess portion, the first recess portion is arranged on a side of the first substrate close to the second substrate, the second substrate includes a second recess portion, the second recess portion is arranged on a side of the second substrate close to the first substrate, and the first recess portion and the second recess portion surround to form the accommodating slot.

Alternatively, in some embodiments of the present disclosure, the second display module includes a driving substrate and a light-emitting diode (LED) chip disposed on the driving substrate, the driving substrate is arranged in the first recess portion and covers the seam, and the LED chip is disposed on a surface of the driving substrate away from the first recess portion.

Alternatively, in some embodiments of the present disclosure, the driving substrate is a printed circuit board-based driving substrate.

Alternatively, in some embodiments of the present disclosure, the first substrate includes a base and a thin film transistor structure layer disposed on the base, and the first recess portion is formed on the base.

Alternatively, in some embodiments of the present disclosure, the second substrate includes:

- a substrate, where the second recess portion is formed on the substrate;
- a black matrix, where the black matrix is arranged on a surface of the substrate close to the first substrate, and the black matrix is disposed in the display area; and
- a plurality of color resist blocks arranged in the black matrix.

Alternatively, in some embodiments of the present disclosure, the splicing display panel further includes a liquid crystal layer, the liquid crystal layer is disposed between the first substrate and the second substrate, and the liquid crystal layer is disposed in the display area.

Alternatively, in some embodiments of the present disclosure, the second display module includes a driving substrate and an organic light-emitting diode (OLED) light-emitting functional layer, the driving substrate is disposed in the first recess portion and covers the seam, and the OLED light-emitting functional layer is disposed on a surface of the driving substrate away from a bottom surface of the first recess portion.

Alternatively, in some embodiments of the present disclosure, a distance from a bottom of the first recess portion to a bottom of the second recess portion is equal to a thickness of the second display module.

Alternatively, in some embodiments of the present disclosure, a width of the accommodating cavity is equal to a width of the second display module.

Alternatively, in some embodiments of the present disclosure, a distance between two adjacent pixels of the first display module is equal to a distance between two adjacent pixels of the second display module.

The embodiments of the present disclosure also provide a splicing display panel, which includes:

- at least two spliced first display modules, where there is a seam between two of the first display modules which are adjacent and spliced, each of the first display modules includes a display area and a bezel area arranged outside the display area, a portion of the first display module corresponding to the bezel area is provided with an accommodating slot, an opening of the accommodating slot is arranged on a side of the bezel area close to the seam, and the opening of the accommodating slot is communicated with the seam; and in two adjacent first display modules, the accommodating slot of one of the first display modules is spliced with the accommodating slot of another one of the first display modules to form an accommodating cavity;

at least one second display module arranged in the accommodating cavity, where the second display module covers the seam;

a magnetic member; and a magnetic metal layer.

The backlight module is configured to provide a backlight of the first display modules.

Alternatively, in some embodiments of the present disclosure, each of the first display modules includes a first substrate and a second substrate opposite to the first substrate, the first substrate includes a first recess portion, the first recess portion is arranged on a side of the first substrate close to the second substrate, the second substrate includes a second recess portion, the second recess portion is arranged on a side of the second substrate close to the first substrate, and the first recess portion and the second recess portion surround to form the accommodating slot.

Alternatively, in some embodiments of the present disclosure, the second display module includes a driving substrate and a light-emitting diode (LED) chip disposed on the driving substrate, the driving substrate is arranged in the first recess portion and covers the seam, and the LED chip is disposed on a surface of the driving substrate away from the first recess portion.

Alternatively, in some embodiments of the present disclosure, the magnetic member is provided at a bottom of the first recess portion, and the magnetic metal layer is disposed on a side of the driving substrate away from the LED chip.

Alternatively, in some embodiments of the present disclosure, the driving substrate is a printed circuit board-based driving substrate.

Alternatively, in some embodiments of the present disclosure, the first substrate includes a base and a thin film transistor structure layer disposed on the base, and the first recess portion is formed on the base.

Alternatively, in some embodiments of the present disclosure, the second substrate includes:

a substrate, where the second recess portion is formed on the substrate;

a black matrix, where the black matrix is arranged on a surface of the substrate close to the first substrate, and the black matrix is disposed in the display area; and a plurality of color resist blocks arranged in the black matrix.

Alternatively, in some embodiments of the present disclosure, the splicing display panel further includes a liquid crystal layer, the liquid crystal layer is disposed between the first substrate and the second substrate, and the liquid crystal layer is disposed in the display area.

The embodiments of the present disclosure provide the splicing display panel. The splicing display panel includes at least two spliced first display modules, at least one second display module, and an optically clear adhesive. There is the seam between two of the first display modules which are adjacent and spliced, each of the first display modules includes the display area and the bezel area arranged outside the display area. The portion of the first display module corresponding to the bezel area is provided with the accommodating slot. The opening of the accommodating slot is arranged on the side of the bezel area close to the seam, and the opening of the accommodating slot is communicated with the seam. Two of the accommodating slots are spliced to form the accommodating cavity. The at least one second display module is arranged in the accommodating cavity, and the second display module covers the seam. The optically clear adhesive is filled in the seam.

In the embodiments of the present disclosure, the accommodating slot is provided in the portion of the first display module corresponding to the bezel area. The accommodating slot is spliced with the accommodating slot of the adjacent first display module to form the accommodating cavity. The second display module is arranged in the accommodating cavity and covers the seam, which realizes a seamless splicing of the splicing display panel, improves a utilization rate of a screen of the splicing display panel, and improves a display quality. In addition, the opening of the accommodating slot of the embodiments of the present disclosure is disposed on the side close to the seam. Therefore, there is no step difference between the first display module and the second display module, which ensures a flatness of a light-emitting surface of the splicing display panel and effectively improves the flatness of the light-emitting surface. Users cannot see a side surface of the second display module from a side view, which can improve a technical problem of dark shadows at the seam in the side view, and greatly improve the display quality.

BRIEF DESCRIPTION OF THE DRAWINGS

In order to illustrate technical solutions in the embodiments of the present disclosure more clearly, the following briefly introduces accompanying drawings required for the description of the embodiments. Obviously, the drawings in the following description are only some examples of the present disclosure. For those skilled in the art, other drawings can also be obtained from these drawings without creative efforts.

DETAILED DESCRIPTION

Figure 1:
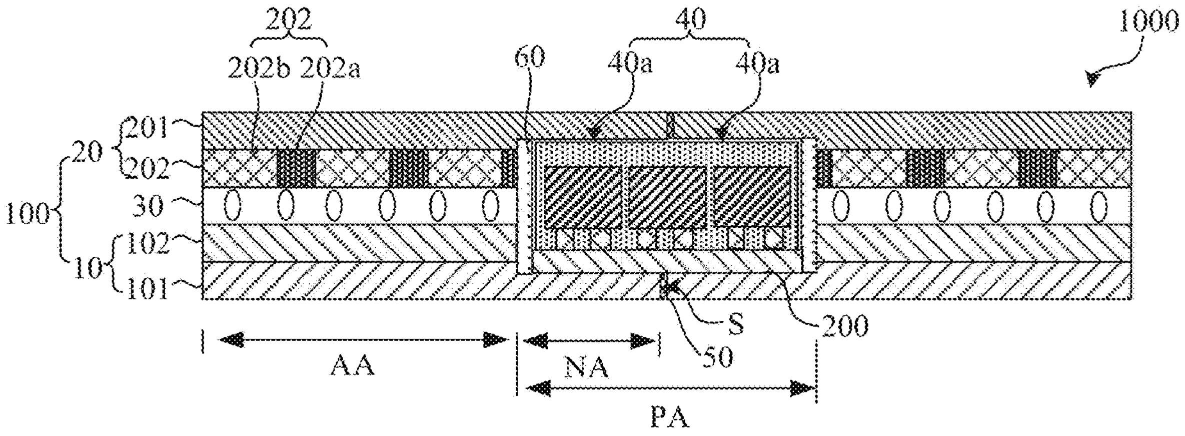
FIG. 1 is a first structural schematic diagram of a splicing display panel of some embodiments of the present disclosure.

In order to make purposes, technical solutions, and advantages of the present disclosure more clear, the present disclosure will be further described in detail below with reference to the accompanying drawings. Reference is made to the drawings in the accompanying drawings, wherein like reference numerals represent like components. The following description is based on the specific embodiments of the present disclosure and should not be construed as limiting other specific embodiments of the present disclosure not detailed herein. As used in this specification, a term "embodiment" means an instance, instance, or illustration.

In the description of the present disclosure, it should be understood that directions or location relationships indicated by terms "center", "longitudinal", "landscape", "length", "width", "thickness", "upper", "lower", "front", "rear", "left", "right", "vertical", "horizontal", "top", "bottom", "inner", "outer", "clockwise", and "counterclockwise" are directions or location relationships shown based on the accompanying drawings, are merely used for the convenience of describing the present disclosure and simplifying the description, but are not used to indicate or imply that a device or an element must have a particular direction or must be constructed and operated in a particular direction, and therefore, cannot be understood as a limitation to the present disclosure. In addition, terms "first" and "second" are merely used to describe the objective, but cannot be understood as indicating or implying relative importance or implying a quantity of indicated technical features. Therefore, features limited by "first" and "second" may indicate explicitly or implicitly that one or more features are included. In the description of the present disclosure, unless otherwise specifically limited, "plurality of" means at least two, for example, two or three.

Embodiments of the present disclosure provide a splicing display panel. Each of them will be described in detail below. It should be noted that the description order of the following embodiments is not intended to limit the preferred order of the embodiments.

Embodiments of the present disclosure provide a splicing display panel. The splicing display panel includes at least two spliced first display modules, at least one second display module, and an optically clear adhesive. There is a seam between two of the first display modules which are adjacent and spliced. Each of the first display modules includes a display area and a bezel area arranged outside the display area. A portion of the first display module corresponding to the bezel area is provided with an accommodating slot. An opening of the accommodating slot is arranged on a side of the bezel area close to the seam, and the opening of the accommodating slot is communicated with the seam. In two adjacent first display modules, the accommodating slot of one of the first display modules is spliced with the accommodating slot of another one of the first display modules to form an accommodating cavity. The at least one second display module is arranged in the accommodating cavity, and the second display module covers the seam. The optically clear adhesive is filled in the seam.

In the embodiments of the present disclosure, the accommodating slot is provided in the portion of the first display module corresponding to the bezel area. The accommodating slot is spliced with the accommodating slot of the adjacent first display module to form the accommodating cavity. The second display module is arranged in the accommodating cavity and covers the seam, which realizes a seamless splicing of the splicing display panel, improves a utilization rate of a screen of the splicing display panel, and improves a display quality. In addition, the opening of the accommodating slot of the embodiments of the present disclosure is disposed on the side close to the seam. Therefore, there is no step difference between the first display module and the second display module, which ensures a flatness of a light-emitting surface of the splicing display panel and effectively improves the flatness of the light-emitting surface. Users cannot see a side surface of the second display module from a side view, which can improve a technical problem of dark shadows at the seam in the side view, and greatly improve the display quality.

A driving substrate of the present disclosure will be described in detail below through specific embodiments.

Figure 2:
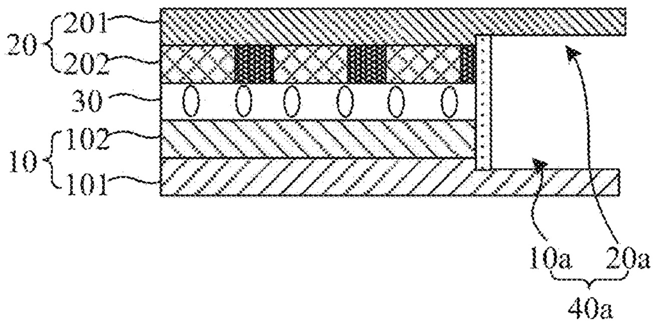
FIG. 2 is a structural schematic diagram of a first display module of the present disclosure.
Figure 3:
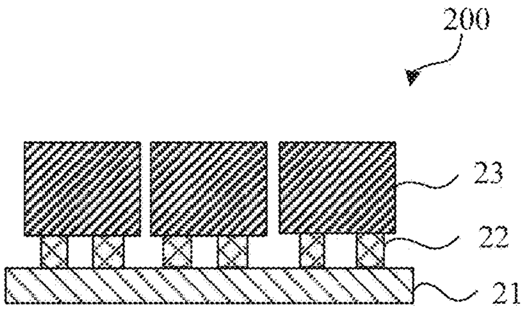
FIG. 3 is a structural schematic diagram of a second display module of some embodiments of the present disclosure.

Referring to FIG. 1, FIG. 2, and FIG. 3, FIG. 1 is a first structural schematic diagram of a splicing display panel of some embodiments of the present disclosure, FIG. 2 is a structural schematic diagram of a first display module of the present disclosure, and FIG. 3 is a structural schematic diagram of a second display module of some embodiments of the present disclosure. Some embodiments of the present disclosure provide a splicing display panel. The splicing display panel 1000 includes at least two spliced first display modules 100, at least one second display module 200, and an optically clear adhesive (OCA) 50. There is a seam S between two of the first display modules 100 which are adjacent and spliced. Each of the first display modules 100 includes a display area AA and a bezel area NA arranged outside the display area AA. A portion of the first display module 100 corresponding to the bezel area NA is provided with an accommodating slot 40*a*. An opening of the accommodating slot 40*a* is arranged on a side of the bezel area NA close to the seam S, and the opening of the accommodating slot 40*a* is communicated with the seam S. In two adjacent first display modules 100, the accommodating slot 40*a* of one of the first display modules 100 is spliced with the accommodating slot 40*a* of another one of the first display modules 100 to form an accommodating cavity 40. The at least one second display module 200 is arranged in the accommodating cavity 40, and the second display module 200 covers the seam S. The optically clear adhesive 50 is filled in the seam S.

In the embodiments of the present disclosure, the accommodating slot 40*a* is provided in the portion of the first display module 100 corresponding to the bezel area NA. The accommodating slot 40*a* is spliced with the accommodating slot 40*a* of the adjacent first display module 100 to form the accommodating cavity 40. The second display module 200 is arranged in the accommodating cavity 40 and covers the seam S, which realizes a seamless splicing of the splicing display panel 1000, improves a utilization rate of a screen of the splicing display panel 1000, and improves a display quality. In addition, the opening of the accommodating slot 40*a* of the embodiments of the present disclosure is disposed on the side close to the seam S. Therefore, there is no step difference between the first display module 100 and the second display module 200, which ensures a flatness of a light-emitting surface of the splicing display panel and effectively improves the flatness of the light-emitting surface. Users cannot see a side surface of the second display module 200 from a side view, which can improve a technical problem of dark shadows at the seam in the side view, and greatly improve the display quality.

It should be noted that, in the embodiments of the present disclosure, the first display module 100 may be one of a liquid crystal display (LCD) module and an organic light-emitting diode (OLED) display module. The embodiments of the present disclosure are described by taking the first display module as the liquid crystal display module as an example, but is not limited thereto.

It should be understood that, in the embodiments of the present disclosure, the bezel area NA of one first display module 100 is spliced with the bezel area NA of the adjacent first display module 100 to form a seam PA.

Referring to FIG. 2, the first display module 100 includes a first substrate 10 and a second substrate 20 opposite to the first substrate 10. The first substrate 10 includes a first recess portion 10*a*. The first recess portion 10*a* is disposed on a side of the first substrate 10 close to the second substrate 20. The second substrate 20 includes a second recess portion 20*a*. The second recess portion 20*a* is disposed on a side of the second substrate 20 close to the first substrate 10. The first recess portion 10*a* and the second recess portion 20*a* surround to form the accommodating slot 40*a*.

The first substrate 10 includes a base 101 and a thin film transistor structure layer 102 disposed on the base 101. The first recess portion 10*a* is formed on the base 101.

In some embodiments, the base 101 may be a glass substrate with a thickness greater than or equal to 0.5 mm. For example, the thickness of the base 101 may be any one of 0.5 mm, 0.7 mm, 0.9 mm, and 1 mm. Since the thickness of the base 101 of the embodiments of the present disclosure is greater than or equal to 0.5 mm, a risk of breakage of the base 101 is prevented when the base 101 corresponding to the bezel area NA is subjected to a thinning processing.

It should be understood that the thin film transistor structure layer provided by the embodiments of the present disclosure is a thin film transistor structure layer of the known technology, which may include any one of a bottom gate type thin film transistor, a top gate type thin film transistor, and a double gate type thin film transistor, which will not be repeated here.

The second substrate 20 includes a substrate 201 and a color filter layer 202 disposed on a side of the substrate 201 close to the first substrate 10. The color filter layer 202 includes a black matrix 202*a* and a plurality of color resist blocks 202*b*. The second recess portion 20*a* is formed on the substrate 201. The black matrix 202*a* is disposed on a surface of the substrate 201 close to the first substrate 10, and the black matrix 202*a* is disposed in the display area AA. The color resist blocks 202*b* are disposed between the black matrices 202*a*. In the embodiments of the present disclosure, the portion corresponding to the bezel area NA is not provided with the black matrix structure. Therefore, no light-shielding structure covers the second display module 200, which improves the utilization rate of the screen of the first display modules 100, and realizes a narrow bezel design. In addition, since the substrate 201 is provided with the second recess portion 20*a*, a thickness of the substrate 201 corresponding to the bezel area NA is reduced, so that the light of the directly displayed second display module 200 can be uniformly transmitted.

In some embodiments, the substrate 201 may be a glass substrate with a thickness greater than or equal to 0.5 mm. For example, the thickness of the substrate 201 may be any one of 0.5 mm, 0.7 mm, 0.9 mm, and 1 mm. Since the thickness of the substrate 201 of the embodiments of the present disclosure is greater than or equal to 0.5 mm, a risk of breakage of the substrate 201 is prevented when the substrate 201 corresponding to the bezel area NA is subjected to a thinning processing, and the light of the display area AA is facilitated to transmit uniformly.

The color resist blocks include red color blocks, green color resist blocks, and blue color resist blocks.

The first display module 100 also includes a sealant 60. The sealant 60 is disposed between the first substrate 10 and the second substrate 20. The first substrate 10 is adhered to the second substrate 20 through the above-mentioned sealant 60. The sealant 60 is provided on a peripheral side of the liquid crystal layer 30. That is, the sealant 60 is arranged around the liquid crystal layer 30, and the sealant 60 is arranged corresponding to the bezel area NA of the first display module 100.

In some embodiments, the color filter layer 202 may also be disposed on the first substrate 10. A color filter on array (COA) technology is adopted to improve a pixel aperture of the splicing display panel 1000.

In some embodiments, the splicing display panel 1000 further includes a liquid crystal layer 30. The liquid crystal layer 30 is disposed between the first substrate 10 and the second substrate 20, and the liquid crystal layer 30 is disposed in the display area AA. In the embodiments of the present disclosure, the first display modules 100 are liquid crystal display modules. Since the liquid crystal display module usually uses a sealant to encapsulate a liquid crystal structure, black matrix and sealing regions located at an edge of the display module lead to obvious black edges, which is not conducive to the realization of the narrow bezel. Especially in liquid crystal splicing display panels, there are usually dark lines in the splicing seams including the sealing region between adjacent liquid crystal display panels. Therefore, in the embodiments, the accommodating slot 40*a* is provided in the portion corresponding to the bezel area NA of the first display modules 100. The accommodating slot 40*a* is spliced with the accommodating slot 40*a* of the adjacent first display modules 100 to form the accommodating cavity 40. The second display module 200 is disposed in the accommodating cavity 40 and covers the seam S. The seamless splicing of the splicing display panel 1000 is realized, the utilization rate of the screen of the splicing display panel 1000 is improved, and the display quality is improved.

Referring to FIG. 3, the second display module 200 includes a driving substrate 21, a connection pad 22, and an LED chip 23. The driving substrate 21 is arranged in the first recess portion 10*a* and covers the seam S. The connection pad 22 is disposed on the driving substrate 21. The LED chip 23 is disposed on a surface of the driving substrate 21 away from a bottom of the first recess portion 10*a*. The LED chip 23 is electrically connected to the driving substrate 21 through the connection pad 22, and the driving substrate 21 is configured to drive the LED chip 23 to emit light.

In some embodiments, the driving substrate 21 includes a printed circuit board (PCB)-based driving substrate, a glass-based driving substrate, and the like.

In some embodiments, the LED chip 23 may be a micro-LED chip or a mini-LED chip. The second display module 200 uses small-sized light-emitting diodes such as micro-LED and mini-LED to emit light for display. By improving the process and panel design, it is possible to manufacture micro-LED light-emitting structures and mini-LED light-emitting structures with smaller pitches. When the pitch between the light-emitting diodes of the micro-LED light-emitting structure and the mini-LED light-emitting structure is reduced, on the one hand, a higher-resolution display can be realized with a narrow seam to enhance the display performance, on the other hand, it can visually achieve a borderless effect, and it is better to integrate with the first display modules 100 to make the display screen more continuous and complete.

In some embodiments, a distance from a bottom of the first recess portion 10*a* to a bottom of the second recess portion 20*a* is equal to a thickness of the second display module 200. A width of the accommodating cavity 40 is equal to a width of the second display module 200. The second display module 200 is engaged in the accommodating cavity 40. Therefore, the second display module 200 does not shake, and a stability of the splicing display panel 1000 is improved.

In some embodiments, a distance between two adjacent pixels of the first display module 100 is equal to a distance between two adjacent pixels of the second display module 200. A color gamut synchronization between the first display module 100 and the second display module 200 is realized, which further improves the display quality of the splicing display panel 1000.

The use of the OCA optical adhesive has higher strength when making surface connections. In addition, the OCA optical adhesive has a large light transmittance and can effectively eliminate the seam S. The seam S is the small spacing seam generated in a middle when the first display modules 100 are spliced together. Due to a small distance of the seam, it usually does not affect the display effect. However, filling the seam S with the optically clear adhesive 50 can display more complete and continuous images. Therefore, the OCA optical adhesive can not only ensure a stability of the connection between the two adjacent first display modules 100, but also make a product surface more flat to avoid the problem of uneven thickness, thereby improving the display performance of the splicing display panel 1000.

In some embodiments, material of the optically clear adhesive 50 is selected from one or any combination of organic silicone, acrylic glue, epoxy sealant, and polyurethane glue. In the present disclosure, polymer material has high viscosity, high density, and high transmittance of light. Therefore, the embodiments of the present disclosure select optical materials with high water and oxygen barrier capabilities, such as organic silicone, acrylic glue, epoxy sealant, and polyurethane glue, which have both high water and oxygen barrier capabilities and excellent optical properties. The optically clear adhesive 50 provided by the embodiments of the present disclosure can be directly attached to two adjacent bezel areas NA without introducing an adhesive layer.

Figure 4:
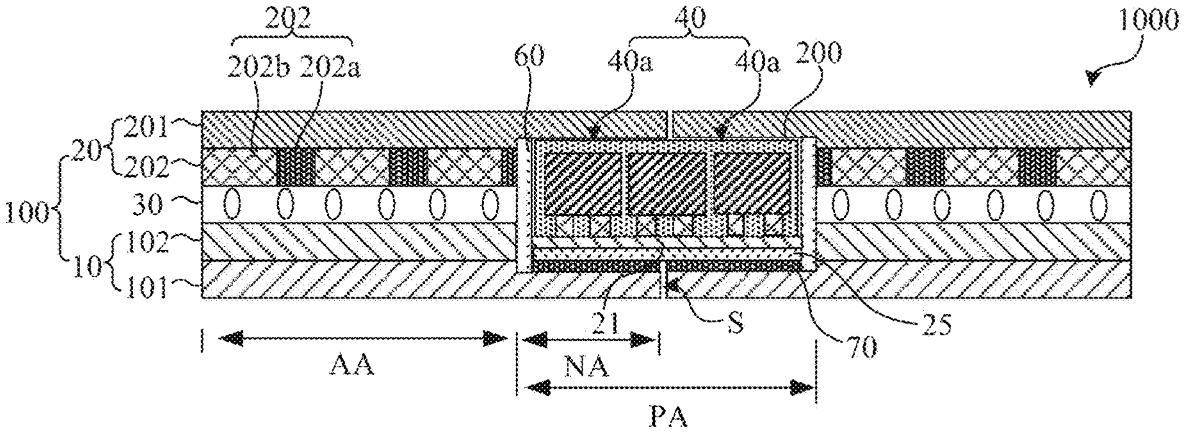
FIG. 4 is a second structural schematic diagram of a splicing display panel of some embodiments of the present disclosure.

Referring to FIG. 4, FIG. 4 is a second structural schematic diagram of a splicing display panel of some embodiments of the present disclosure. A difference between the splicing display panel 1000 provided by the embodiments of the present disclosure and the splicing display panel 1000 provided in FIG. 1 is that the splicing display panel 1000 does not include an optically clear adhesive, instead, the splicing display panel 1000 includes a magnetic member 70 and a magnetic metal layer 25. The magnetic member 70 is provided at a bottom of the first recess portion 10*a*. The magnetic metal layer 25 is disposed on a side of the driving substrate 21 away from the LED chip 23. When the first display module 100 and the second display module 200 are spliced together, the magnetic member 70 and the magnetic metal layer 25 are magnetically attracted to each other, thereby realizing a rapid splicing of the splicing display panel 1000.

Figure 5:
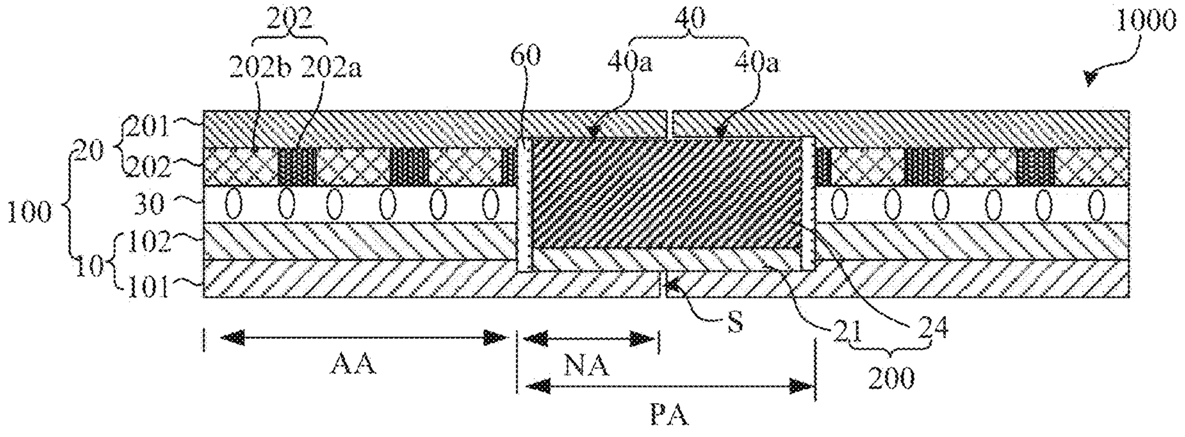
FIG. 5 is a third structural schematic diagram of a splicing display panel of some embodiments of the present disclosure.

Referring to FIG. 5, FIG. 5 is a third structural schematic diagram of a splicing display panel of some embodiments of the present disclosure. A difference between the splicing display panel 1000 provided by the embodiments of the present disclosure and the splicing display panel 1000 provided in FIG. 1 is that the second display module 200 includes a driving substrate 21 and an OLED light-emitting functional layer 24. The driving substrate 21 is disposed in the first recess portion 10*a* and covers the seam S. The OLED light-emitting functional layer 24 is disposed on a surface of the driving substrate 21 away from a bottom surface of the first recess portion 10*a*. The second display module 200 of the embodiments of the present disclosure is an OLED display module, and the splicing type provided by the splicing display panel 1000 is added to meet the customer's demand for the type of the splicing display panel 1000.

The OLED light-emitting functional layer 24 may include an anode, a pixel definition layer, a light-emitting layer, and a cathode. The anode is connected to the driving substrate 21. The pixel definition layer is disposed on the anode. The pixel definition layer includes an opening. The opening exposes a portion of the anode. The light emitting layer is defined in the opening, and the cathode is arranged on the pixel definition layer.

Figure 6:
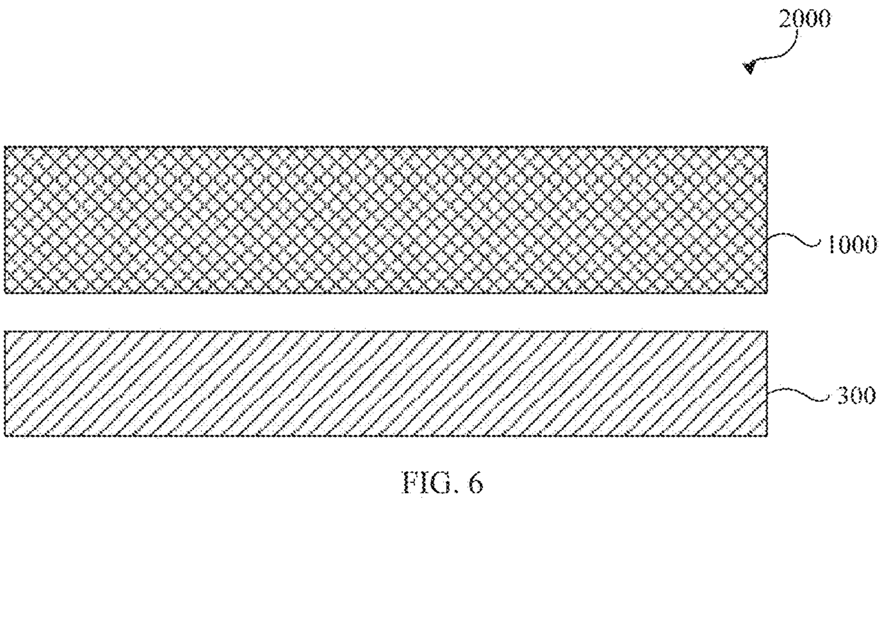
FIG. 6 is a structural schematic diagram of a splicing display device of some embodiments of the present disclosure.

Some embodiments of the present disclosure also provide a splicing display device. Referring to FIG. 6, FIG. 6 is a structural schematic diagram of a splicing display device of some embodiments of the present disclosure. The splicing display device 2000 includes a splicing display panel 1000 and a backlight module 300. The splicing display panel 1000 is the splicing display panel 1000 described in any one of the above. The backlight module 300 is configured to provide the backlight of the first display modules.

The embodiments of the present disclosure provide the splicing display device, and the splicing display device 2000 includes the splicing display panel 1000 and the backlight module 300. Referring to FIG. 1 to FIG. 5, the splicing display panel 1000 includes at least two spliced first display modules 100 and at least one second display module 200. There is a seam S between two of the first display modules 100 which are adjacent and spliced. Each of the first display modules 100 includes a display area AA and a bezel area NA arranged outside the display area AA. A portion of the first display module 100 corresponding to the bezel area NA is provided with an accommodating slot 40*a*. An opening of the accommodating slot 40*a* is arranged on a side of the bezel area NA close to the seam S, and the opening of the accommodating slot 40*a* is communicated with the seam S. In two adjacent first display modules 100, the accommodating slot 40*a* of one of the first display modules 100 is spliced with the accommodating slot 40*a* of another one of the first display modules 100 to form an accommodating cavity 40. The at least one second display module 200 is arranged in the accommodating cavity 40, and the second display module 200 covers the seam S.

In the embodiments of the present disclosure, the accommodating slot 40*a* is provided in the portion of the first display module 100 corresponding to the bezel area NA. The accommodating slot 40*a* is spliced with the accommodating slot 40*a* of the adjacent first display module 100 to form the accommodating cavity 40. The second display module 200 is arranged in the accommodating cavity 40 and covers the seam S, which realizes a seamless splicing of the splicing display panel 1000, improves a utilization rate of a screen of the splicing display panel 1000, and improves a display quality. In addition, the opening of the accommodating slot 40*a* of the embodiments of the present disclosure is disposed on the side close to the seam S. Therefore, there is no step difference between the first display module 100 and the second display module 200, which ensures a flatness of a light-emitting surface of the splicing display panel and effectively improves the flatness of the light-emitting surface. Users cannot see a side surface of the second display module 200 from a side view, which can improve a technical problem of dark shadows at the seam in the side view, and greatly improve the display quality.

The splicing display device 2000 of the present disclosure can be applied to electronic devices. The electronic device may be at least one of a smartphone, a tablet, an e-book reader, a computer, a media player, a mobile medical machine, a camera, a game console, a car navigator, and an electronic billboard.

In summary, although the present disclosure has been disclosed above with preferred embodiments, the above preferred embodiments are not intended to limit the present disclosure. Various changes and modifications can be made by those of ordinary skill in the art without departing from the spirit and scope of the present disclosure. Therefore, the protection scope of the present disclosure is subject to the scope defined by the claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A splicing display panel, comprising:

at least two spliced first display modules, wherein there is a seam between two of the first display modules which are adjacent and spliced, each of the first display modules comprises a display area and a bezel area arranged outside the display area, a portion of the first display module corresponding to the bezel area is provided with an accommodating slot, an opening of the accommodating slot is arranged on a side of the bezel area close to the seam, and the opening of the accommodating slot is communicated with the seam; and in two adjacent first display modules, the accommodating slot of one of the first display modules is spliced with the accommodating slot of another one of the first display modules to form an accommodating cavity;

at least one second display module arranged in the accommodating cavity, wherein the second display module covers the seam;

a magnetic member; and a magnetic metal layer;

wherein each of the first display modules comprises a first substrate and a second substrate opposite to the first substrate, the first substrate comprises a first recess portion, the first recess portion is arranged on a side of the first substrate close to the second substrate, the second substrate comprises a second recess portion, the second recess portion is arranged on a side of the second substrate close to the first substrate, and the first recess portion and the second recess portion surround to form the accommodating slot.

2. The splicing display panel according to claim 1, wherein the second display module comprises a driving substrate and a light-emitting diode (LED) chip disposed on the driving substrate, the driving substrate is arranged in the first recess portion and covers the seam, and the LED chip is disposed on a surface of the driving substrate away from the first recess portion.

3. The splicing display panel according to claim 2, wherein the magnetic member is provided at a bottom of the first recess portion, and the magnetic metal layer is disposed on a side of the driving substrate away from the light-emitting diode (LED) chip.

4. The splicing display panel according to claim 2, wherein the driving substrate is a printed circuit board-based driving substrate.

5. The splicing display panel according to claim 1, wherein the first substrate comprises a base and a thin film transistor structure layer disposed on the base, and the first recess portion is formed on the base.

6. The splicing display panel according to claim 5, wherein the second substrate comprises:

a substrate, wherein the second recess portion is formed on the substrate;

a black matrix, wherein the black matrix is arranged on a surface of the substrate close to the first substrate, and the black matrix is disposed in the display area; and a plurality of color resist blocks arranged in the black matrix.

7. The splicing display panel according to claim 1, wherein the splicing display panel further comprises a liquid crystal layer, the liquid crystal layer is disposed between the first substrate and the second substrate, and the liquid crystal layer is disposed in the display area.

8. The splicing display panel according to claim 1, wherein the second display module comprises a driving substrate and an organic light-emitting diode (OLED) light-emitting functional layer, the driving substrate is disposed in the first recess portion and covers the seam, and the OLED light-emitting functional layer is disposed on a surface of the driving substrate away from a bottom surface of the first recess portion.

9. The splicing display panel according to claim 1, wherein a distance from a bottom of the first recess portion to a bottom of the second recess portion is equal to a thickness of the second display module.

10. The splicing display panel according to claim 1, wherein a width of the accommodating cavity is equal to a width of the second display module.

11. The splicing display panel according to claim 1, wherein a distance between two adjacent pixels of the first display module is equal to a distance between two adjacent pixels of the second display module.

12. The splicing display panel according to claim 1, wherein each of the first display modules further comprises a sealant, the sealant is disposed within the first recess portion and the second recess portion.

13. The splicing display panel according to claim 12, wherein the sealant is disposed on a side of the accommodating slot away from the at least one second display module.

14. The splicing display panel according to claim 13, wherein the sealant is separated from edges of the seam by a certain distance.

15. A splicing display panel, comprising:

at least two spliced first display modules, wherein there is a seam between two of the first display modules which are adjacent and spliced, each of the first display modules comprises a display area and a bezel area arranged outside the display area, a portion of the first display module corresponding to the bezel area is provided with an accommodating slot, an opening of the accommodating slot is arranged on a side of the bezel area close to the seam, and the opening of the accommodating slot is communicated with the seam; and in two adjacent first display modules, the accommodating slot of one of the first display modules is spliced with the accommodating slot of another one of the first display modules to form an accommodating cavity;

at least one second display module arranged in the accommodating cavity, wherein the second display module covers the seam;

a magnetic member; and a magnetic metal layer;

wherein a length of the magnetic member is equal to a length of the magnetic metal layer and is equal to a width of the second display module.

16. The splicing display panel according to claim 15, wherein each of the first display modules comprises a first substrate and a second substrate opposite to the first substrate, the first substrate comprises a first recess portion, the first recess portion is arranged on a side of the first substrate close to the second substrate, the second substrate comprises a second recess portion, the second recess portion is arranged on a side of the second substrate close to the first substrate, and the first recess portion and the second recess portion surround to form the accommodating slot.

17. The splicing display panel according to claim 16, wherein the second display module comprises a driving substrate and a light-emitting diode (LED) chip disposed on the driving substrate, the driving substrate is arranged in the first recess portion and covers the seam, and the LED chip is disposed on a surface of the driving substrate away from the first recess portion.

18. The splicing display panel according to claim 17, wherein the magnetic member is provided at a bottom of the first recess portion, and the magnetic metal layer is disposed on a side of the driving substrate away from the light-emitting diode (LED) chip.

19. The splicing display panel according to claim 17, wherein the driving substrate is a printed circuit board-based driving substrate.

20. The splicing display panel according to claim 17, wherein the first substrate comprises a base and a thin film transistor structure layer disposed on the base, and the first recess portion is formed on the base.

* * * * *